(12) United States Patent
Lin et al.

(10) Patent No.: US 7,763,928 B2
(45) Date of Patent: Jul. 27, 2010

(54) MULTI-TIME PROGRAMMABLE MEMORY

(75) Inventors: Yu-Hsien Lin, Hsinchu County (TW);
 Wen-Fang Lee, Hsinchu (TW);
 Ya-Huang Huang, Hsinchu (JP);
 Ming-Yen Liu, Hsinchu (TW); Yu-Kang Shen, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 303 days.

(21) Appl. No.: 11/755,752

(22) Filed: May 31, 2007

(65) Prior Publication Data

US 2008/0296655 A1 Dec. 4, 2008

(51) Int. Cl.
 *H01L 29/76* (2006.01)
 *H01L 29/788* (2006.01)

(52) U.S. Cl. ............... 257/314; 257/315; 257/E29.129; 257/E21.393

(58) Field of Classification Search ......... 257/314–321, 257/E29.129, E29.3
 See application file for complete search history.

(56) References Cited

U.S. PATENT DOCUMENTS

| 4,935,378 | A | * | 6/1990 | Mori | ........................... | 438/453 |
| 5,208,175 | A | | 5/1993 | Choi et al. | | |
| 2003/0127682 | A1 | * | 7/2003 | Lee et al. | ..................... | 257/315 |

\* cited by examiner

*Primary Examiner*—Hoai v Pham
(74) *Attorney, Agent, or Firm*—Chun-Ming Shih (57) ABSTRACT

A multi-time programmable (MTP) memory includes a tunneling dielectric layer, a floating gate, an inter-gate dielectric layer and a control gate. The tunneling dielectric layer is disposed on a substrate. The floating gate is disposed on the tunneling dielectric layer. The inter-gate dielectric layer is disposed on the floating gate, and a thickness of the inter-gate dielectric layer at edges of the floating gate is larger than a thickness of the inter-gate dielectric layer in a central portion of the floating gate. The control gate is disposed on the inter-gate dielectric layer.

6 Claims, 9 Drawing Sheets

MULTI-TIME PROGRAMMABLE MEMORY

BACKGROUND OF THE INVENTION

1. Field of the Invention

The present invention relates to a semiconductor device, and more particularly to a multi-time programmable (MTP) memory and a method of manufacturing the same for superior data retention.

2. Description of Related Art

A multi-time programmable (MTP) memory device is a type of a memory device that allows multiple data writing, reading and erasing operations, and the data stored in the MTP memory can be retained even after power supply to the device is cut off. With the aforesaid advantages, the MTP memory has been widely employed in personal computers and electronic equipment.

Typically, a floating gate and a control gate of the MTP memory device are generally fabricated using doped polysilicon. The floating gate is sandwiched between the control gate and a substrate and is disposed in a floating state without connecting to other circuits, while the control gate is connected to a word line. In addition, the MTP memory also includes a tunneling oxide layer disposed between the substrate and the floating gate and an inter-gate dielectric layer disposed between the floating gate and the control gate.

The most common issue of the MTP memory device is related to undesirable data retention. One of the major factors resulting in insufficient data retention lies in the inter-gate dielectric layer disposed between the control gate and the floating gate. In other words, the data retention of the MTP memory device is determined by the quality of the inter-gate dielectric layer between the control gate and the floating gate.

A method of fabricating a conventional MTP memory device includes the following steps. First, a polysilicon layer and a mask layer are formed and patterned. The patterned polysilicon layer is utilized as a floating gate. Next, a growth process is performed to form a gate oxide layer of a high voltage device. Thereafter, the mask layer is removed, and growth processes are then performed to sequentially construct a gate oxide layer of a medium voltage device and a gate oxide layer of a low voltage device, respectively. Besides, a silicon oxide layer is formed on top of the floating gate as an inter-gate dielectric layer. Afterwards, a control gate is constructed. According to the aforesaid manufacturing process, the inter-gate dielectric layer disposed on top of the floating gate is formed during the growth processes of the gate oxide layer of the medium voltage device and the low voltage device. Thus, a thickness of the inter-gate dielectric layer is usually less than 150 angstroms, which leads to defects in the inter-gate dielectric layer. With said defects existing in the inter-gate dielectric layer between the control gate and the floating gate, electrical charges stored in the floating gate enter the control gate through said defects, easily causing leakage current of the device. In addition, the inter-gate dielectric layer between a top corner of the floating gate and the control gate is in a relatively thin thickness, and leakage current of the device is generated more easily, deteriorating reliability of the device.

SUMMARY OF THE INVENTION

The present invention is directed to an MTP memory and a method of manufacturing the same. In the MTP memory of the present invention, an inter-gate dielectric layer is disposed between a floating gate and a control gate, and a thickness of the inter-gate dielectric layer at edges of the floating gate is larger than a thickness of the inter-gate dielectric layer in a central portion of the floating gate. Therefore, data retention can be improved.

The present invention is further directed to an MTP memory and a method of manufacturing the same. The method of manufacturing the MTP memory is rather simple, and a floating gate having a rounded top corner leads to improved data retention.

The present invention is further directed to an MTP memory and a method of manufacturing the same. Due to a simple process of manufacturing the MTP memory, the fabrication of the MTP memory can be integrated into the fabrication of periphery circuit devices, reducing the manufacturing costs.

The present invention provides an MTP memory including a tunneling dielectric layer, a floating gate, a first inter-gate dielectric layer and a control gate. The tunneling dielectric layer is disposed on a substrate. The floating gate is disposed on the tunneling dielectric layer. The first inter-gate dielectric layer is disposed on the floating gate. Here, the first inter-gate dielectric layer has a first thickness at edges of the floating gate and a second thickness in a central portion of the floating gate, and the first thickness is larger than the second thickness. The control gate is disposed on the first inter-gate dielectric layer.

According to one embodiment of the present invention, the floating gate has a rounded top corner.

According to one embodiment of the present invention, the MTP memory further includes a second inter-gate dielectric layer which is disposed at a sidewall of the floating gate.

According to one embodiment of the present invention, the control gate is extended onto the second inter-gate dielectric layer.

According to one embodiment of the present invention, a material of the first inter-gate dielectric layer and a material of the second inter-gate dielectric layer include silicon oxide.

According to one embodiment of the present invention, a material of the control gate includes doped polysilicon.

According to one embodiment of the present invention, a material of the floating gate includes doped polysilicon.

According to one embodiment of the present invention, a material of the tunneling dielectric layer includes silicon oxide.

In the MTP memory of the present invention, the thickness of the first inter-gate dielectric layer at the edges of the floating gate is larger than the thickness of the first inter-gate dielectric layer in the central portion of the floating gate. Accordingly, leakage current is not prone to occur between the top corner of the floating gate and the control gate. Moreover, the rounded top corner of the floating gate is capable of preventing electrical field concentration, spike discharge, and leakage current of the device, bringing about an improvement of data retention.

The present invention further provides a method of manufacturing an MTP memory. The method includes the following steps. First, a substrate is provided, and a tunneling dielectric layer, a first conductive layer, a first inter-gate dielectric layer and a mask layer are sequentially formed on the substrate. Next, the mask layer, the first inter-gate dielectric layer, the first conductive layer and the tunneling dielectric layer are patterned. Here, the patterned first conductive layer serves as a floating gate. A second inter-gate dielectric layer is then formed on a sidewall of the floating gate, and a thickness of the first inter-gate dielectric layer at edges of the floating gate is increased. Thereafter, the mask layer is removed, and a control gate is formed on the substrate.

According to one embodiment of the present invention, the step of forming the second inter-gate dielectric layer on the sidewall of the floating gate and increasing the thickness of the first inter-gate dielectric layer at the edges of the floating gate includes performing a thermal oxidation process.

According to one embodiment of the present invention, a material of the first inter-gate dielectric layer and a material of the second inter-gate dielectric layer include silicon oxide.

According to one embodiment of the present invention, the method of manufacturing the MTP memory further includes performing a thermal oxidation process after the removal of the mask layer to increase the thickness of the first inter-gate dielectric layer.

According to one embodiment of the present invention, a material of the mask layer is silicon nitride.

According to one embodiment of the present invention, the step of forming the control gate on the substrate further includes forming a second conductive layer on the substrate and then patterning the second conductive layer.

According to one embodiment of the present invention, a material of the control gate includes doped polysilicon.

According to one embodiment of the present invention, a material of the floating gate includes doped polysilicon.

According to one embodiment of the present invention, a material of the tunneling dielectric layer includes silicon oxide.

According to one embodiment of the present invention, the floating gate of the MTP memory has a rounded top corner.

In the method of manufacturing the MTP memory provided by the present invention, the first inter-gate dielectric layer is disposed between the mask layer and the floating gate. The thickness of the first inter-gate dielectric layer at the edges of the floating gate can then be increased by implementing the thermal oxidation process, whereby the top corner of the floating gate is rounded. Accordingly, data retention of the device can be improved. Further, due to the simple process of manufacturing the MTP memory in the present invention, the fabrication of the MTP memory can be integrated into the fabrication of normal periphery circuit devices, reducing the manufacturing costs.

The present invention further provides a method of manufacturing an MTP memory. The method includes the following steps. First, a substrate is provided. The substrate at least includes a first region and a second region. A tunneling dielectric layer, a first conductive layer, a first inter-gate dielectric layer and a mask layer are then formed on the substrate. Next, the mask layer, the first inter-gate dielectric layer, the first conductive layer and the tunneling dielectric layer in the second region are removed, and the mask layer, the first inter-gate dielectric layer, the first conductive layer and the tunneling dielectric layer in the first region are patterned, such that a floating gate is formed in the first region. Thereafter, a first gate dielectric layer is formed on the second region of the substrate, and a second inter-gate dielectric layer is constructed on a sidewall of the floating gate in the first region. Besides, a thickness of the first inter-gate dielectric layer at edges of the floating gate is increased. After the removal of the mask layer, a control gate is formed on the first region of the substrate, while a first gate is formed on the second region of the substrate.

According to one embodiment of the present invention, the step of forming the first gate dielectric layer on the second region of the substrate and the second inter-gate dielectric layer on the sidewall of the floating gate in the first region and increasing the thickness of the first inter-gate dielectric layer at the edges of the floating gate includes performing a thermal oxidation process.

According to one embodiment of the present invention, a material of the first inter-gate dielectric layer and a material of the second inter-gate dielectric layer include silicon oxide.

According to one embodiment of the present invention, a material of the mask layer is silicon nitride.

According to one embodiment of the present invention, the step of forming the control gate on the first region of the substrate and the first gate on the second region of the substrate includes forming a second conductive layer on the substrate at first, and patterning the second conductive layer.

According to one embodiment of the present invention, a material of the control gate and a material of the first gate include doped polysilicon.

According to one embodiment of the present invention, a material of the floating gate includes doped polysilicon.

According to one embodiment of the present invention, a material of the tunneling dielectric layer includes silicon oxide.

According to one embodiment of the present invention, the floating gate has a rounded top corner.

According to one embodiment of the present invention, the step of removing the mask layer, the first inter-gate dielectric layer, the first conductive layer and the tunneling dielectric layer in the second region and patterning the mask layer, the first inter-gate dielectric layer, the first conductive layer and the tunneling dielectric layer in the first region to form the floating gate in the first region includes forming a patterned photoresist layer over the substrate at first, and removing the mask layer, the first inter-gate dielectric layer, the first conductive layer and the tunneling dielectric layer using the patterned photoresist layer as a mask. Then, the patterned photoresist layer is removed.

According to one embodiment of the present invention, the substrate further includes a third region, and after the removal of the mask layer, the method of manufacturing the MTP memory further includes removing the first inter-gate dielectric layer, the first conductive layer and the tunneling dielectric layer in the third region and forming a second gate dielectric layer on the third region of the substrate. Simultaneously, the thickness of the first inter-gate dielectric layer in the first region is increased. After that, a second gate is formed on the substrate of the third region.

According to one embodiment of the present invention, the step of forming the second gate dielectric layer on the third region of the substrate and increasing the thickness of the first inter-gate dielectric layer in the first region includes performing a thermal oxidation process.

According to one embodiment of the present invention, the step of removing the first inter-gate dielectric layer, the first conductive layer and the tunneling dielectric layer in the third region includes forming a patterned photoresist layer over the substrate at first. The patterned photoresist layer covers the first region and the second region. Next, the first inter-gate dielectric layer, the first conductive layer and the tunneling dielectric layer are removed using the patterned photoresist layer as a mask. Afterwards, the patterned photoresist layer is removed.

According to one embodiment of the present invention, the substrate further includes a third region and a fourth region, and after the removal of the mask layer, the method of manufacturing the MTP memory further includes removing the first inter-gate dielectric layer, the first conductive layer and the tunneling dielectric layer in the third region and in the fourth region. Next, a second gate dielectric layer is formed on the third region and the fourth region of the substrate, and the thickness of the first inter-gate dielectric layer in the first region is increased. After that, the second gate dielectric layer in the fourth region is removed, and a third gate dielectric layer is formed on the fourth region of the substrate. Besides, the thickness of the first inter-gate dielectric layer in the first region and a thickness of the second gate dielectric layer in the third region are increased. Thereafter, a second gate is formed on the third region of the substrate, and a third gate is constructed on the fourth region of the substrate.

According to one embodiment of the present invention, the step of forming the second gate dielectric layer on the third region and the fourth region of the substrate and increasing the thickness of the first inter-gate dielectric layer in the first region includes performing a thermal oxidation process.

According to one embodiment of the present invention, the step of forming the third gate dielectric layer on the fourth region of the substrate and increasing the thickness of the first inter-gate dielectric layer in the first region and the thickness of the second gate dielectric layer in the third region includes performing a thermal oxidation process.

According to one embodiment of the present invention, the step of removing the first inter-gate dielectric layer, the first conductive layer and the tunneling dielectric layer in the third region and the fourth region includes forming a patterned photoresist layer over the substrate at first. The patterned photoresist layer covers the first region and the second region. Next, the first inter-gate dielectric layer, the first conductive layer and the tunneling dielectric layer are removed using the patterned photoresist layer as a mask. Afterwards, the patterned photoresist layer is removed.

In the method of manufacturing the MTP memory disclosed in the present invention, the first inter-gate dielectric layer is disposed between the mask layer and the floating gate. The thickness of the first inter-gate dielectric layer at the edges of the floating gate can then be increased during the formation of the first gate dielectric layer in the second region, and the top corner of the floating gate can also be rounded. Accordingly, data retention of the device can be improved.

Moreover, in the method of manufacturing the MTP memory disclosed in the present invention, the thickness of the first inter-gate dielectric layer can be further increased in the subsequent process of forming the second gate dielectric layer (and the third gate dielectric layer) in the third region (and the fourth region). Therefore, the MTP memory of the present invention can be fabricated through a relatively simple process, and the manufacturing costs are reduced as well.

In order to the make the aforementioned and other objects, features and advantages of the present invention comprehensible, several embodiments accompanied with figures are described in detail below.

DESCRIPTION OF EMBODIMENTS

Figure 1A:
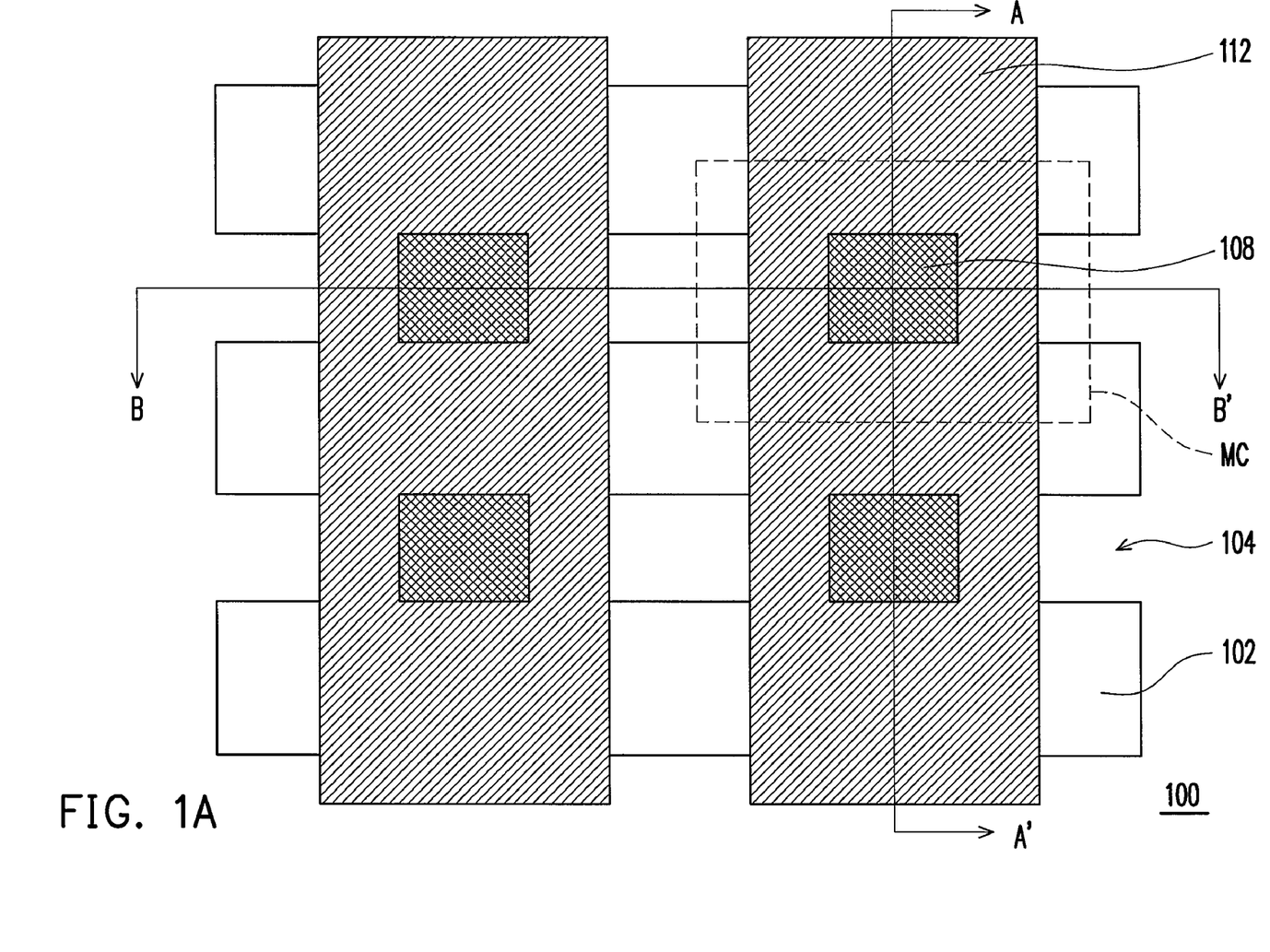
FIG. 1A is a top view depicting an MTP memory of the present invention.
Figure 1B:
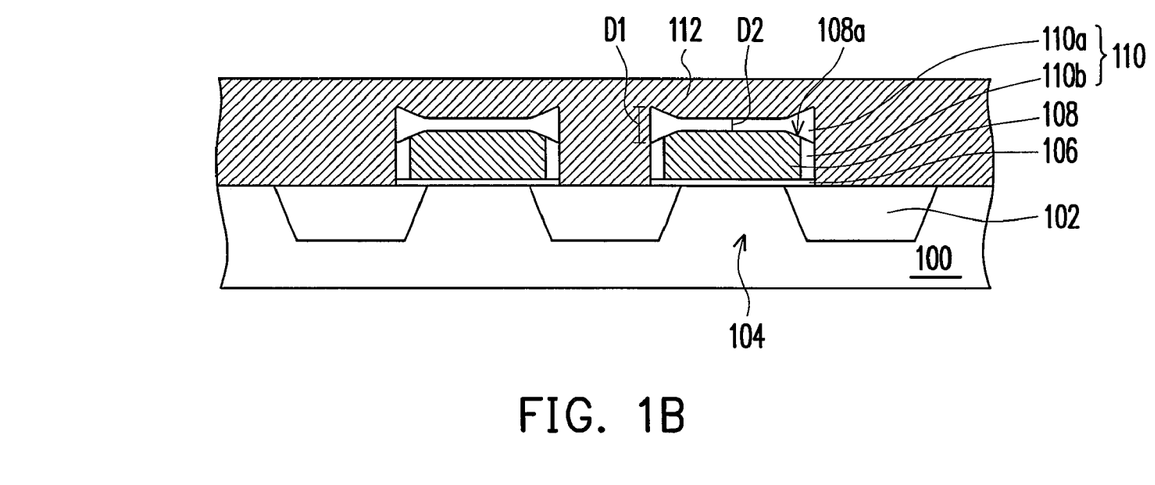
FIG. 1B is a structural cross-sectional view along line A-A' in FIG. 1A.
Figure 1C:
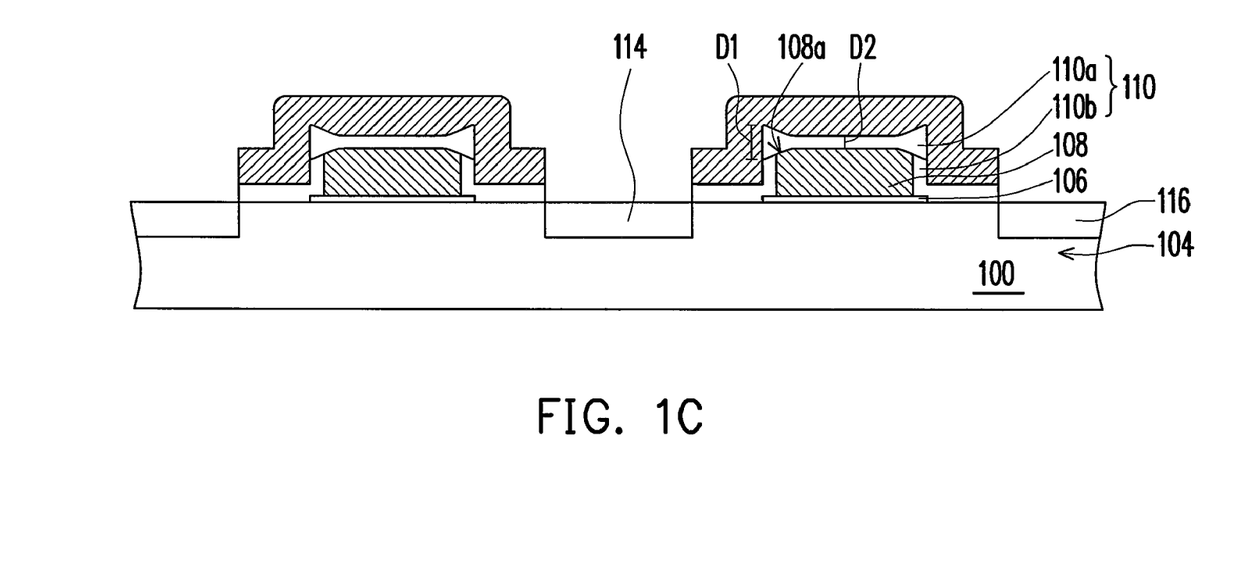
FIG. 1C is a cross-sectional structural view along line B-B' in FIG. 1A.

FIG. 1A is a top view depicting an MTP memory of the present invention. FIG. 1B is a structural cross-sectional view along line A-A' in FIG. 1A. FIG. 1C is a structural cross-sectional view along line B-B' in FIG. 1A.

Referring to FIGS. 1A, 1B and 1C together, an MTP memory MC of the present invention is disposed on a substrate 100. The MTP memory MC includes, for example, a tunneling dielectric layer 106, a floating gate 108, an inter-gate dielectric layer 110 (composed of an inter-gate dielectric layer 110a and an inter-gate dielectric layer 110b), a control gate 112, and source/drain regions 114 and 116.

The substrate 100 is, for example, a silicon substrate. A plurality of device isolation structures 102 is, for example, disposed in the substrate 100 to define active regions 104. The device isolation structures 102 are disposed in the substrate 100 in parallel and extend in an X direction, for example. Besides, the device isolation structures 102 are, for example, shallow trench isolation (STI) structures or field oxide layers.

The tunneling dielectric layer 106 is disposed on the substrate 100, for example, and a material of the tunneling dielectric layer 106 is, for example, silicon oxide or other appropriate dielectric materials.

The floating gate 108 is disposed on the tunneling dielectric layer 106, and a material of the floating gate 108 includes a conductive material such as doped polysilicon, for example. A dopant in the doped polysilicon may be an N-type dopant or a P-type dopant. Besides, the floating gate 108 has a rounded top corner 108a, for example.

The inter-gate dielectric layer 110 is, for example, composed of the inter-gate dielectric layer 110a and the inter-gate dielectric layer 110b. The inter-gate dielectric layer 110a is disposed on the floating gate 108, and the inter-gate dielectric layer 110a has a thickness D1 at edges of the floating gate 108 and a thickness D2 in a central portion of the floating gate 108. The thickness D1 is larger than the thickness D2. On the other hand, the inter-gate dielectric layer 110b is disposed at a sidewall of the floating gate 108, for example. Since the thickness D1 of the inter-gate dielectric layer 110a at the edges of the floating gate 108 is larger than the thickness D2 of the inter-gate dielectric layer 110a in the central portion of the floating gate 108, it is more unlikely to generate leakage current between a top corner 108a of the floating gate 108 and the control gate 112. Moreover, the rounded top corner 108a of the floating gate 108 is capable of preventing electrical field concentration, spike discharge, and leakage current of the device, bringing about an improvement of data retention. A material of the inter-gate dielectric layer 110 (including the inter-gate dielectric layer 110a and the inter-gate dielectric layer 110b) is, for example, silicon oxide or the like.

The control gate 112 is, for example, disposed on the inter-gate dielectric layer 110a and extended onto the inter-gate dielectric layer 110b. The control gate 112 is arranged on the substrate 100 in parallel and extends in a Y direction, for example. The Y direction and the X direction intersect, for example. Besides, a material of the control gate 112 is, for example, conductive materials such as doped polysilicon, metal or metal silicide.

The source region/drain region 114 and 116 are disposed in the substrate 100 at two sides of the control gate 112, for example, and the source/drain region 114 and 116 are P-type or N-type doped regions.

As shown in FIGS. 1A to 1C, the thickness D1 of the inter-gate dielectric layer 110a at the edges of the floating gate 108 is larger than the thickness D2 of the inter-gate dielectric layer 110a in the central portion of the floating gate 108 according to the MTP memory disclosed in the present invention. Therefore, leakage current is not apt to occur between the top corner 108a of the floating gate 108 and the control gate 112. Moreover, the rounded top corner 108a of the floating gate 108 is capable of preventing electrical field concentration, spike discharge, and leakage current of the device, bringing about the improvement of data retention.

Next, a method of manufacturing the MTP memory of the present invention is described hereinafter. FIGS. 2A through 2F are cross-sectional views depicting a process of manufacturing an MTP memory according to one embodiment of the present invention. Moreover, FIGS. 2A through 2F are cross-sectional views along line B-B' in FIG. 1A.

Figure 2A:
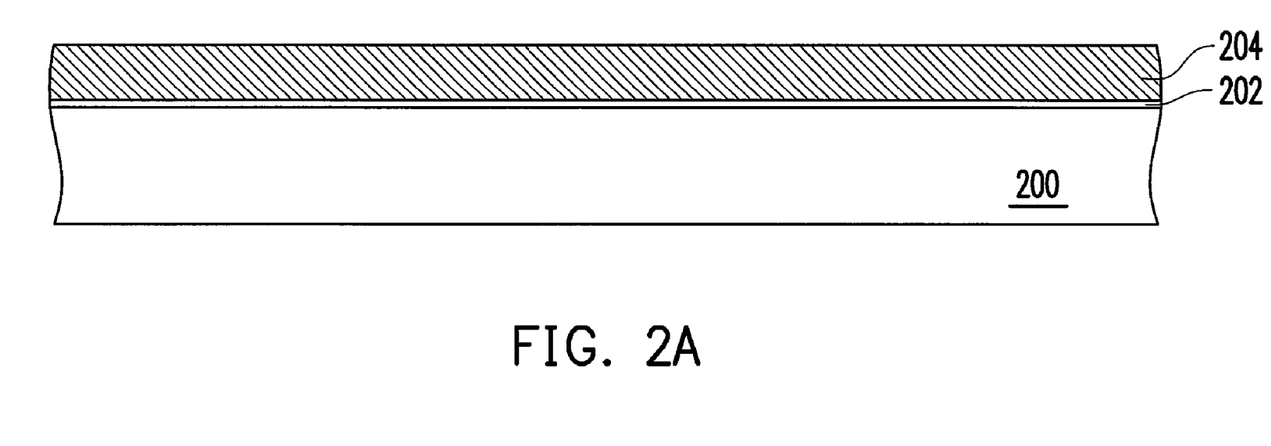
FIGS. 2A through 2F are cross-sectional views depicting a process of manufacturing an MTP memory according to one embodiment of the present invention.

First, as shown in FIG. 2A, a substrate 200 is provided. The substrate 200 is, for example, a silicon substrate. Furthermore, the substrate 200 has a plurality of device isolation structures (not shown) disposed therein to define active regions.

A tunneling dielectric layer 202 and a conductive layer 204 are sequentially formed on the substrate 200. A material of the tunneling dielectric layer 202 is, for example, silicon oxide. A method of forming the tunneling dielectric layer 202 includes performing a thermal oxidation process, for example. On the other hand, a material of the conductive layer 204 is, for example, doped polysilicon. A method of forming the conductive layer 204 includes, for example, performing an ion implantation process after an undoped polysilicon layer (not shown) is formed through a chemical vapor deposition (CVD) process, or a doped polysilicon layer can be formed by adopting an in-situ implanting operation in the CVD process.

Figure 2B:
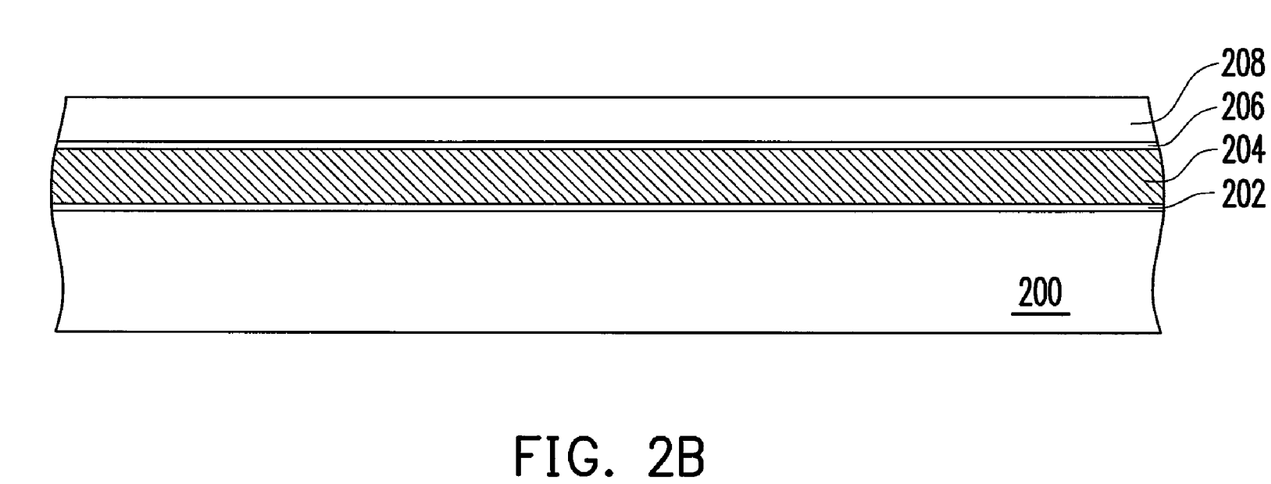

Referring to FIG. 2B, an inter-gate dielectric layer 206 is formed on the conductive layer 204. A material of the inter-gate dielectric layer 206 is, for example, silicon oxide. A method of forming the inter-gate dielectric layer 206 includes performing the thermal oxidation process or the CVD process, for example. It is certain that the material of the inter-gate dielectric layer 206 may also be other insulating materials, and the manufacturing method thereof includes, for example, performing the CVD process using different reaction gases according to the material of the inter-gate dielectric layer 206. Thereafter, a mask layer 208 is formed on the inter-gate dielectric layer 206. A material of the mask layer 208 is, for example, silicon nitride. A method of forming the mask layer 208 includes performing the CVD process, for example.

Figure 2C:
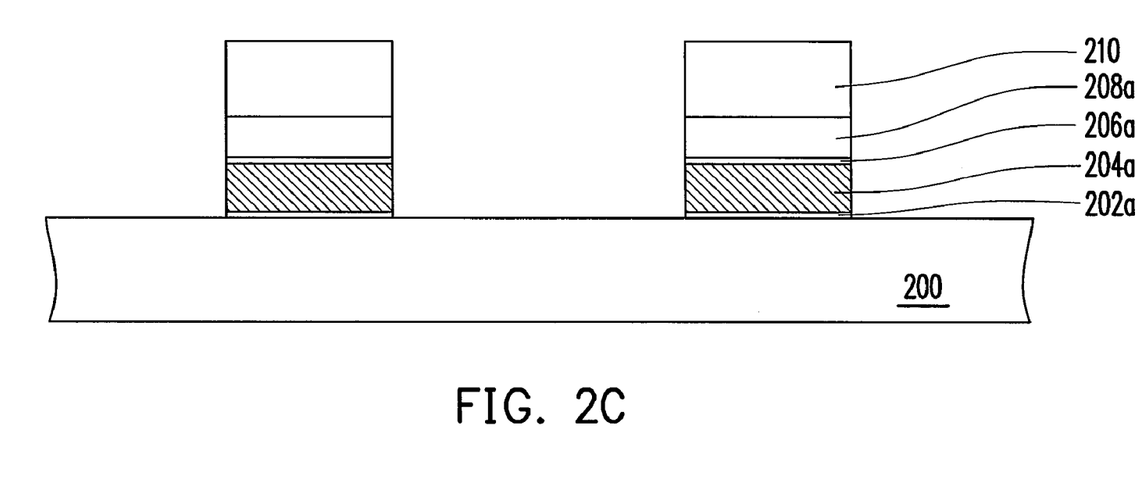

As shown in FIG. 2C, a patterned photoresist layer 210 is formed over the substrate 200. A method of forming the patterned photoresist layer 210 includes forming a photoresist material layer over the whole substrate 200 at first. An exposure process and a development process are then implemented to form the patterned photoresist layer 210. Next, a portion of the mask layer 208, the inter-gate dielectric layer 206, the conductive layer 204 and the tunneling dielectric layer 202 are removed using the patterned photoresist layer 210 as a mask, such that a mask layer 208a, an inter-gate dielectric layer 206a, a conductive layer 204a and a tunneling dielectric layer 202a are constructed. The patterned conductive layer 204a is used as a floating gate. Besides, the step of removing a portion of the mask layer 208, the inter-gate dielectric layer 206, the conductive layer 204 and the tunneling dielectric layer 202 includes a dry etching process, for example, a reactive ion etching operation.

Figure 2D:
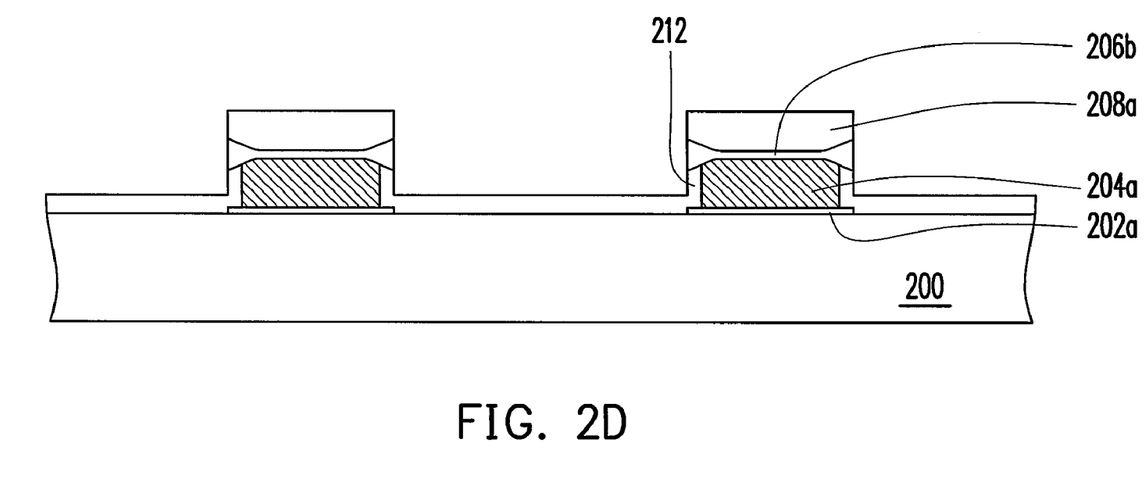

Next, referring to FIG. 2D, the patterned photoresist layer 210 is removed. A method of removing the photoresist layer 210 includes, for example, performing a wet photoresist etching or a dry photoresist etching. After the patterned photoresist layer 210 is removed, another inter-gate dielectric layer 212 is formed at a sidewall of the conductive layer 204a (the floating gate). The inter-gate dielectric layer 212 may also be formed on a surface of the substrate 200. A method of forming the inter-gate dielectric layer 212 includes performing the thermal oxidation process, for example. During the formation of the inter-gate dielectric layer 212, a thickness of the inter-gate dielectric layer 206a at edges of the conductive layer 204a (the floating gate) is increased. Thereby, the inter-gate dielectric layer 206a is turned out to be the inter-gate dielectric layer 206b in which a thickness thereof at the edges of the conductive layer 204a (the floating gate) is larger than the thickness thereof in a central portion of the conductive layer 204a (the floating gate). Since the conductive layer 204a (the floating gate) covered by the mask layer 208a is oxidized, the thickness of the inter-gate dielectric layer 206a at the edges of the conductive layer 204a (the floating gate) is increased. However, at corners of the mask layer 208a i.e. at the edges of the conductive layer 204a (the floating gate), oxygen laterally diffuses, and thereby the conductive layer 204a (the floating gate) positioned at the corners of the mask layer 208a is oxidized to various degrees, such that the thickness of the inter-gate dielectric layer 206a is increased. Moreover, a top corner of the conductive layer 204a (the floating gate) is rounded.

Figure 2E:
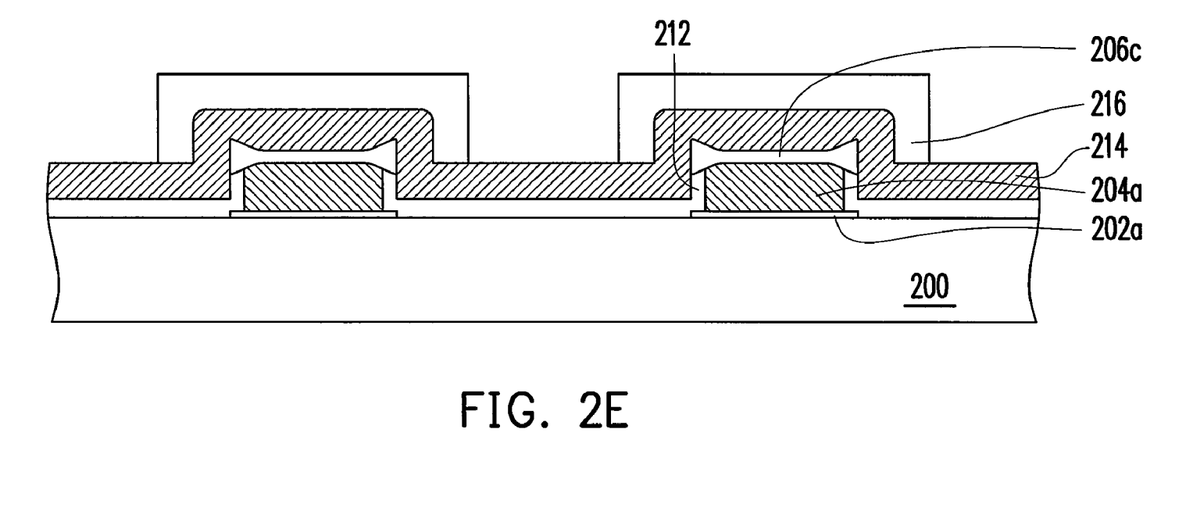

Thereafter, referring to FIG. 2E, the mask layer 208a is removed. A method of removing the mask layer 208a includes, for example, performing the dry etching process or a wet etching process. After the removal of the mask layer 208a, the thermal oxidation process can be alternatively implemented to increase the thickness of the whole inter-gate dielectric layer 206b and an inter-gate dielectric layer 206c is then formed. Here, a thickness of the inter-gate dielectric layer 206c at the edges of the conductive layer 204a (the floating gate) is larger than the thickness of the inter-gate dielectric layer 206c in the central portion of the conductive layer 204a (the floating gate). Then, another conductive layer 214 is subsequently formed over the substrate 200. A material of the conductive layer 214 is, for example, doped polysilicon, and a method of forming the conductive layer 204 includes, for example, performing the ion implantation process after an undoped polysilicon layer (not shown) is formed through the CVD process, or the doped polysilicon layer can be formed by adopting the in-situ implanting operation in the CVD process. The material of the conductive layer 214 may also be other metal materials.

Next, a patterned photoresist layer 216 is formed over the substrate 200. A method of forming the patterned photoresist layer 216 includes forming one photoresist material layer over the whole substrate 200 at first. The exposure process and the development process are then implemented to form the patterned photoresist layer 216.

Figure 2F:
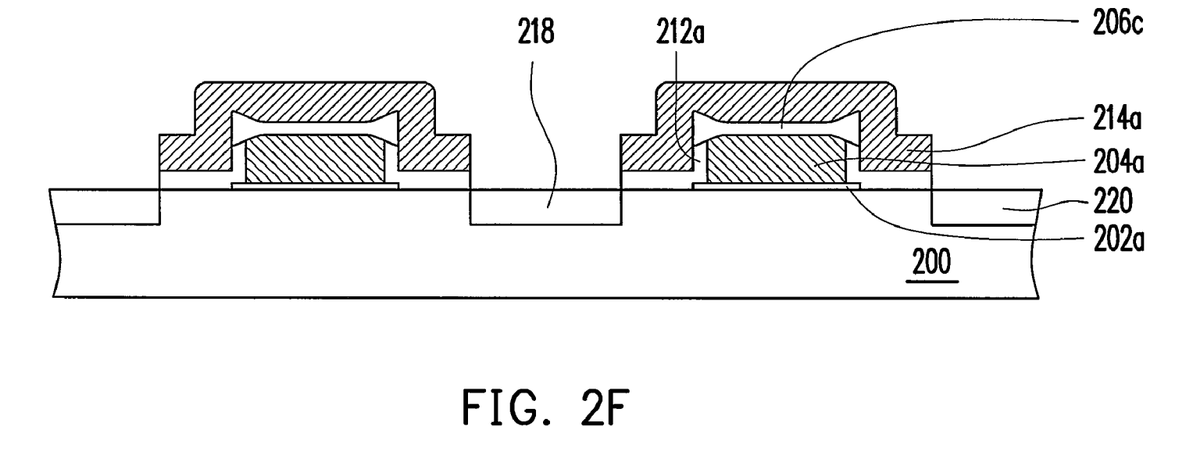

After that, referring to FIG. 2F, a portion of the conductive layer 214 and the inter-gate dielectric layer 212 are removed using the patterned photoresist layer 216 as the mask to form a conductive layer 214a and an inter-gate dielectric layer 212a. The patterned conductive layer 214a is used as a control gate. In addition, a method of removing a portion of the conductive layer 214 and the inter-gate dielectric layer 212 includes performing the dry etching process, such as the reactive ion etching operation, for example. Next, the patterned photoresist layer 216 is removed. In addition, a method of removing the patterned photoresist layer 216 includes, for example, performing the wet photoresist etching or the dry photoresist etching. After the patterned photoresist layer 216 is removed, source/drain regions 218 and 220 are formed in the substrate 200 at sides of the conductive layer 214a (the control gate). A method of forming the source/drain regions 218 and 220 includes performing a dopant implantation process using the conductive layer 214a (the control gate) as the mask. The subsequent process of forming the MTP memory is familiar to those skilled in the art, and thus it is not described hereinafter.

In the method of manufacturing the MTP memory provided by the present invention, the inter-gate dielectric layer 206a is disposed between the mask layer 208a and the conductive layer 204a (the floating gate). Thus, during the formation of the inter-gate dielectric layer 212, the thickness of the inter-gate dielectric layer 212 at the edges of the conductive layer 204a (the floating gate) can be increased, and the top corner of the conductive layer 204a (the floating gate) is rounded, improving data retention of the device. Further, due to the simple process of manufacturing the MTP memory in the present invention, the fabrication of the MTP memory can be integrated into the fabrication of normal periphery circuit devices, reducing the manufacturing costs.

The integration of the fabrication of the MTP memory in the present invention and the fabrication of the normal periphery circuit devices is described in the following embodiment with reference to FIGS. 3A through 3H. FIGS. 3A through 3H are cross-sectional views depicting a process of manufacturing an MTP memory according to another embodiment of the present invention.

Figure 3A:
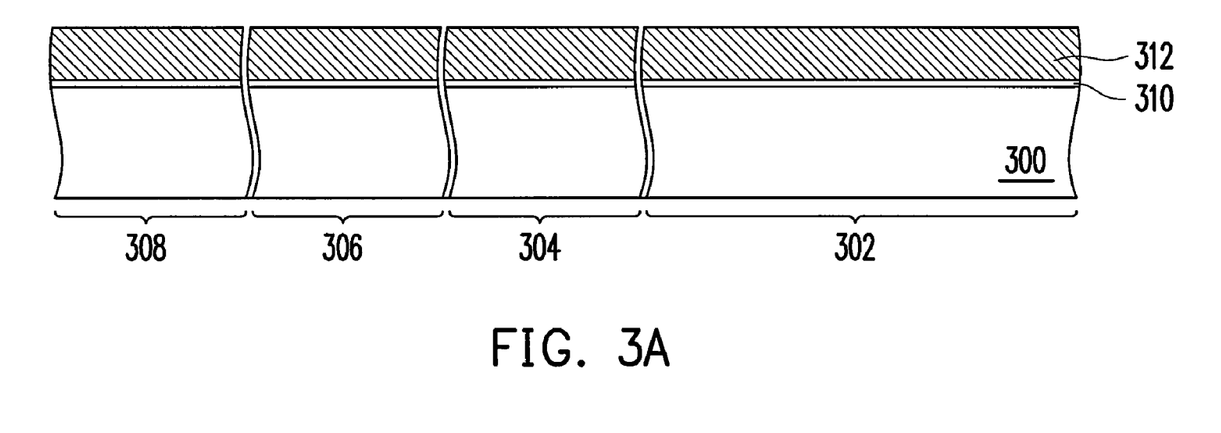
FIGS. 3A through 3H are cross-sectional views depicting a process of manufacturing an MTP memory according to another embodiment of the present invention.

First, as shown in FIG. 3A, a substrate 300 is provided. The substrate 300 is, for example, a silicon substrate. Furthermore, the substrate 300 has a plurality of device isolation structures (not shown) disposed therein to define active regions. The substrate 300 includes a memory cell region 302, a low voltage device region 304, a medium voltage device region 306 and a high voltage device region 308. The memory cell region 302 is a region in which a memory cell is formed, for example, while the low voltage device region 304, the medium voltage device region 306 and the high voltage device region 308 are the regions in which the periphery circuit devices are formed, for example.

Next, a tunneling dielectric layer 310 and a conductive layer 312 are sequentially formed on the substrate 300. A material of the tunneling dielectric layer 310 is, for example, silicon oxide, and a method of forming the tunneling dielectric layer 310 includes performing a thermal oxidation process, for example. A material of the conductive layer 312 is, for example, doped polysilicon, and a method of forming the conductive layer 312 includes, for example, performing an ion implantation process after an undoped polysilicon layer (not shown) is formed through a CVD process, or a doped polysilicon layer can be formed by adopting an in-situ implanting operation in the CVD process.

Figure 3B:
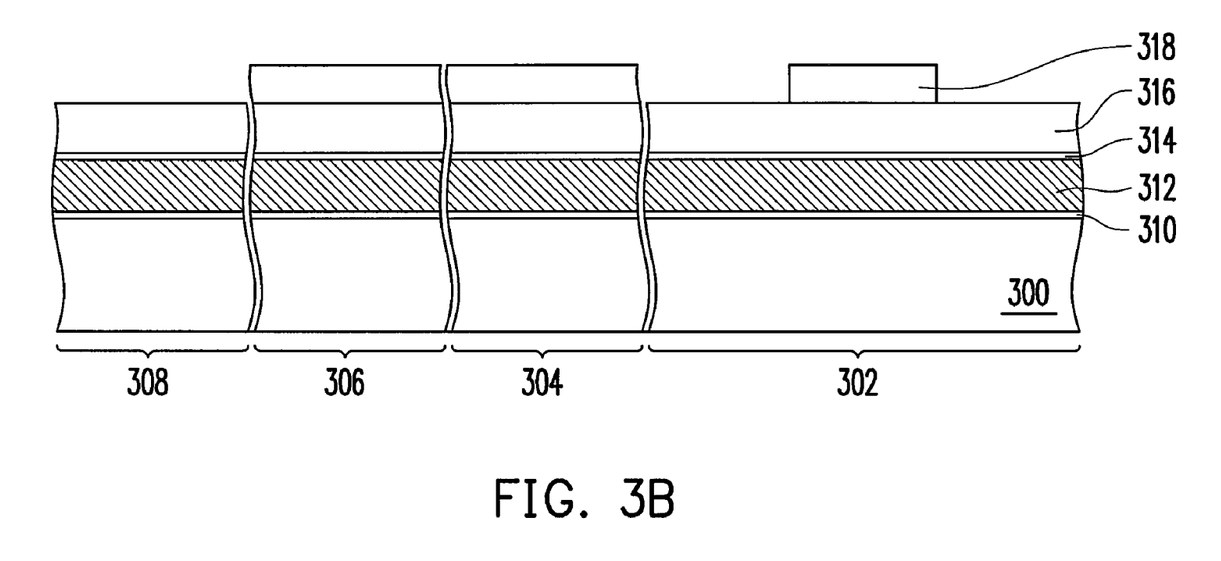

Thereafter, referring to FIG. 3B, an inter-gate dielectric layer 314 is formed on the conductive layer 312. A material of the inter-gate dielectric layer 314 is, for example, silicon oxide, and a method of forming the inter-gate dielectric layer 314 includes performing the thermal oxidation process or the CVD process, for example. It is certain that the material of the inter-gate dielectric layer 314 may also be other insulating materials, and the manufacturing method thereof includes, for example, performing the CVD process using different reaction gases according to the material of the inter-gate dielectric layer 314. Thereafter, a mask layer 316 is formed on the inter-gate dielectric layer 314. A material of the mask layer 316 is, for example, silicon nitride, and a method of forming the mask layer 316 includes carrying out the CVD process, for example.

After that, a patterned photoresist layer 318 is formed over the substrate 300. A method of forming the patterned photoresist layer 318 includes forming a photoresist material layer over the whole substrate 300 at first. An exposure process and a development process are then implemented to form the patterned photoresist layer 318. The patterned photoresist layer 318 covers the low voltage device region 304 and the medium voltage device region 306 but exposes the high voltage device region 308. Besides, the patterned photoresist layer 318 is employed to define a floating gate in the memory cell region 302.

Figure 3C:
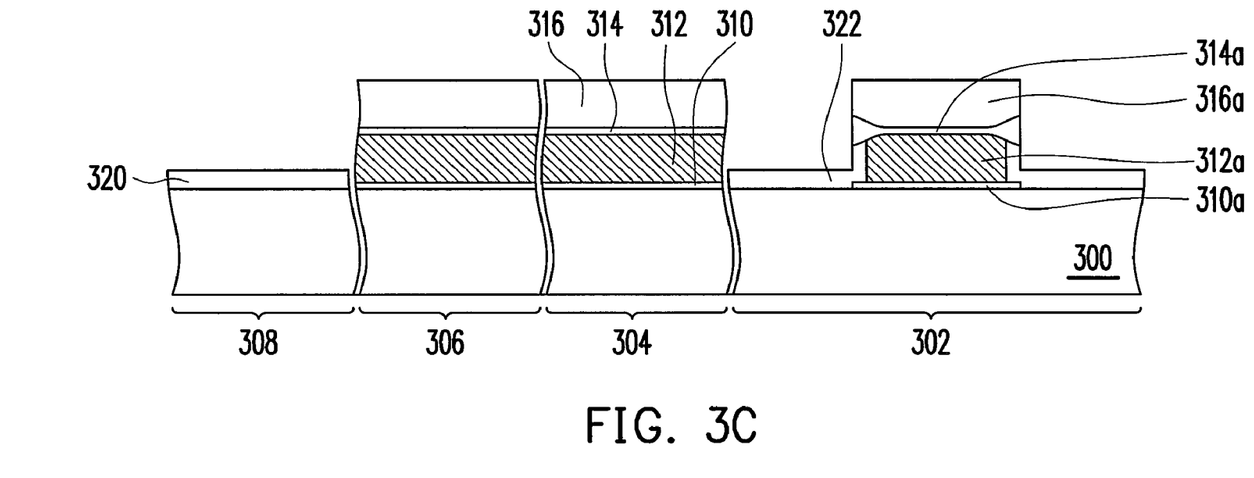

Thereafter, referring to FIG. 3C, the mask layer 316, the inter-gate dielectric layer 314, the conductive layer 312 and the tunneling dielectric layer 310 in the high voltage device region 308 are removed using the patterned photoresist layer 318 as a mask. In addition, the mask layer 316, the inter-gate dielectric layer 314, the conductive layer 312 and the tunneling dielectric layer 310 in the memory cell region 302 are patterned, so as to form a mask layer 316a, an inter-gate dielectric layer 314a, a conductive layer 312a and a tunneling dielectric layer 310a. The patterned conductive layer 312a is used as the floating gate. The mask layer 316, the inter-gate dielectric layer 314, the conductive layer 312 and the tunneling dielectric layer 310 in the low voltage device region 304 and the medium voltage device region 306 are not removed. A method of removing a portion of the mask layer 316, the inter-gate dielectric layer 314, the conductive layer 312 and the tunneling dielectric layer 310 includes performing a dry etching process, such as a reactive ion etching operation, for example.

Next, the patterned photoresist layer 318 is removed. A method of removing the patterned photoresist layer 318 includes, for example, performing a wet photoresist etching or a dry photoresist etching. After the removal of the patterned photoresist layer 318, a gate dielectric layer 320 is formed in the high voltage device region 308 of the substrate 300, and another inter-gate dielectric layer 322 is simultaneously constructed on a sidewall of the conductive layer 312a (the floating gate) in the memory cell region 302. The inter-gate dielectric layer 322 may also be formed on a surface of the substrate 300. In other words, the gate dielectric layer 320 and the inter-gate dielectric layer 322 are fabricated through the same process. A method of forming the gate dielectric layer 320 and the inter-gate dielectric layer 322 includes performing the thermal oxidation process, for example. During the formations of the gate dielectric layer 320 and the inter-gate dielectric layer 322, a thickness of the inter-gate dielectric layer 314a at edges of the conductive layer 312a (the floating gate) is increased. Thereby, the thickness of the inter-gate dielectric layer 314a at the edges of the conductive layer 312a (the floating gate) is larger than a thickness of the inter-gate dielectric layer 314a in a central portion of the conductive layer 312a (the floating gate). Since the conductive layer 312a (the floating gate) covered by the mask layer 316a is oxidized, the thickness of the inter-gate dielectric layer 314a at the edges of the conductive layer 312a (the floating gate) is increased. However, at corners of the mask layer 316a i.e. at the edges of the conductive layer 312a (the floating gate), oxygen laterally diffuses, and thereby the conductive layer 312a (the floating gate) positioned at the corners of the mask layer 316a is oxidized to various degrees, and the thickness of the inter-gate dielectric layer 314a is increased. Moreover, a top corner of the conductive layer 312a (the floating gate) is rounded.

Figure 3D:
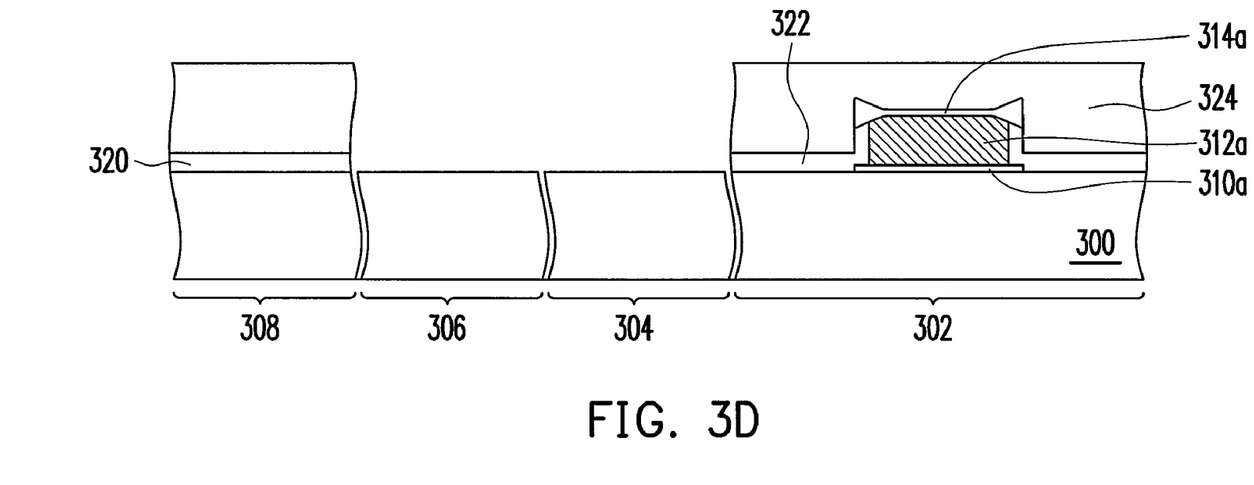

After that, referring to FIG. 3D, the mask layer 316a is removed. A method of removing the mask layer 316a includes, for example, performing the dry etching process or a wet etching process. After that, a patterned photoresist layer 324 is formed over the substrate 300. A method of forming the patterned photoresist layer 324 includes forming one photoresist material layer over the whole substrate 300 at first. The exposure process and the development process are then implemented to form the patterned photoresist layer 324. The patterned photoresist layer 324 covers the memory cell region 302 and the high voltage device region 308 but exposes the low voltage device region 304 and the medium voltage device region 306. Then, the inter-gate dielectric layer 314, the conductive layer 312 and the tunneling dielectric layer 310 in the low voltage device region 304 and the medium voltage device region 306 are removed using the patterned photomask layer 324 as the mask.

Figure 3E:
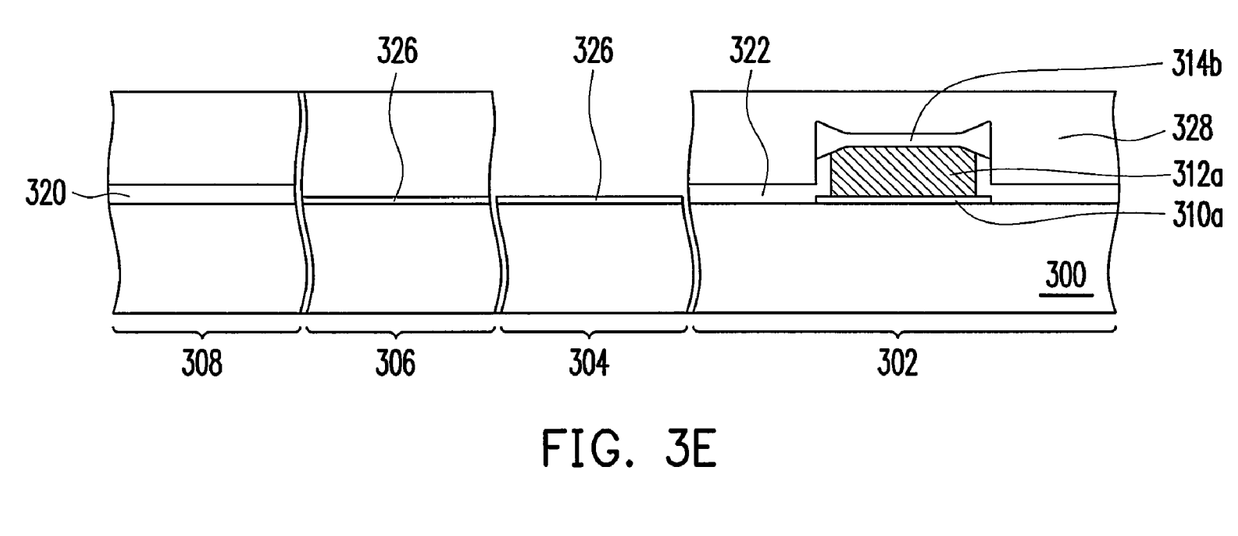

Thereafter, referring to FIG. 3E, the patterned photoresist layer 324 is removed. A method of removing the patterned photoresist layer 324 includes, for example, performing the wet photoresist etching or the dry photoresist etching. After that, a gate dielectric layer 326 is formed on the low voltage device region 304 and the medium voltage device region 306 of the substrate 300. A method of forming the gate dielectric layer 326 includes performing the thermal oxidation process, for example. During the formation of the gate dielectric layer 326, the thickness of the inter-gate dielectric layer 314a in the memory cell region 302 is increased, such that an inter-gate dielectric layer 314b is formed.

Afterwards, a patterned photoresist layer 328 is formed on the substrate 300. A method of forming the patterned photoresist layer 328 includes forming one photoresist material layer over the whole substrate 300 at first. The exposure process and the development process are then implemented to form the patterned photoresist layer 328. The patterned photoresist layer 328 covers the memory cell region 302, the high voltage device region 308 and the medium voltage device region 306 but exposes the low voltage device region 304.

Figure 3F:
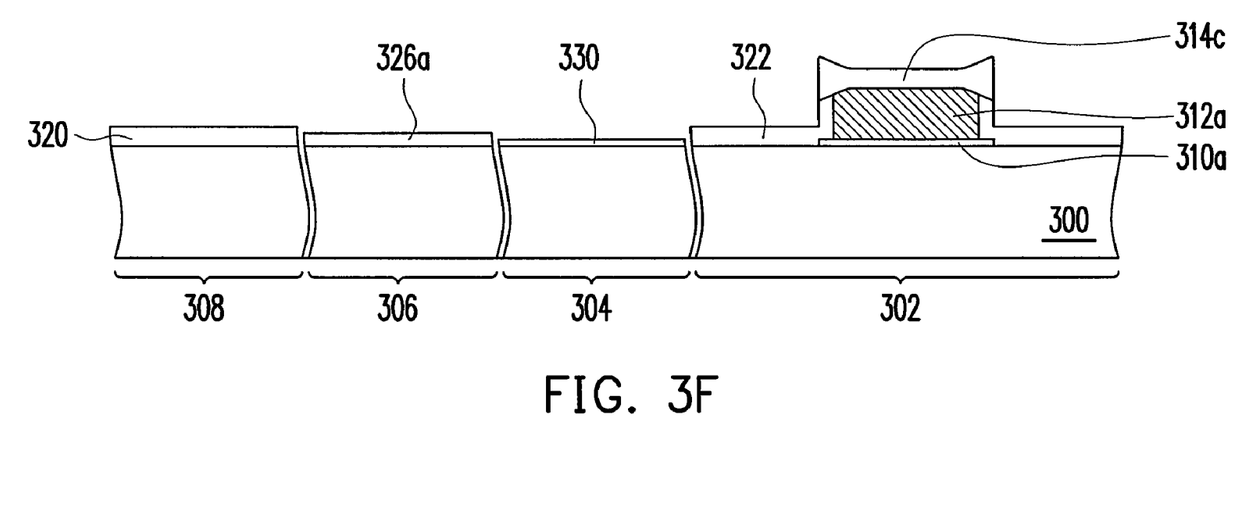

Next, referring to FIG. 3F, the gate dielectric layer 326 in the low voltage device region 304 is removed using the patterned photoresist layer 328 as the mask. A method of removing the gate dielectric layer 326 in the low voltage device region 304 includes performing the dry etching process or the wet etching process, for example. Next, the patterned photoresist layer 328 is removed. A method of removing the patterned photoresist layer 328 includes, for example, performing the wet photoresist etching or the dry photoresist etching. A gate dielectric layer 330 is then formed over the low voltage device region 304 of the substrate 300. A method of forming the gate dielectric layer 330 includes performing the thermal oxidation process, for example. During the formation of the gate dielectric layer 330, a thickness of the whole inter-gate dielectric layer 314b in the memory cell region 302 is increased, such that an inter-gate dielectric layer 314c is formed. Moreover, a thickness of the gate dielectric layer 326 in the medium voltage device region 306 is increased as well, such that a gate dielectric layer 326a is constructed. A thickness of the gate dielectric layer 320 is larger than the thickness of the gate dielectric layer 326a, while the thickness of the gate dielectric layer 326a is larger than a thickness of the gate dielectric layer 330.

Figure 3G:
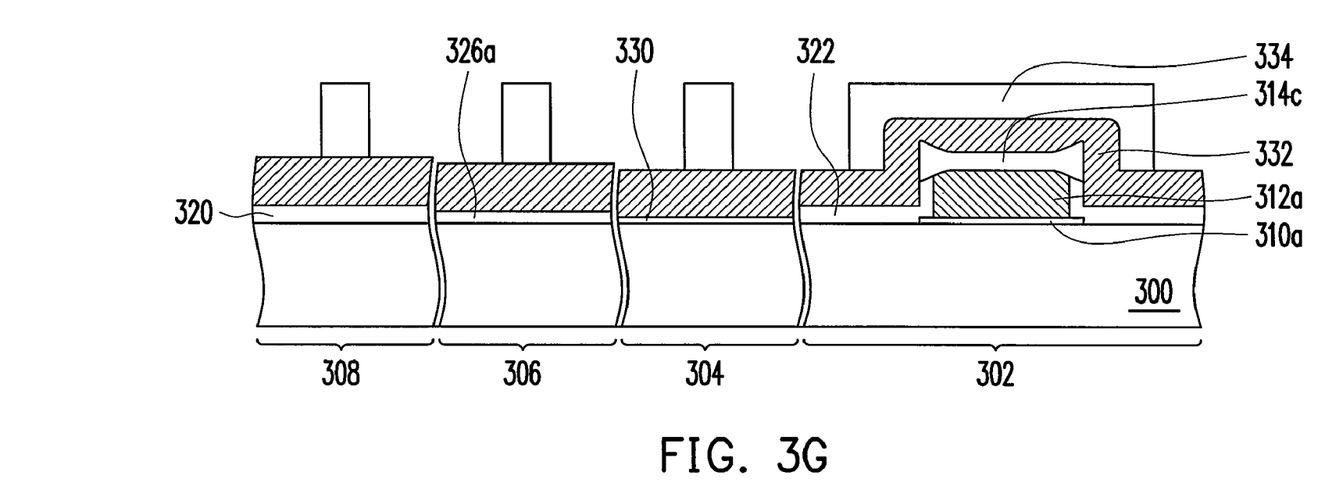

Thereafter, referring to FIG. 3G, another conductive layer 332 is formed over the substrate 300. A material of the conductive layer 332 is, for example, doped polysilicon, and a method of forming the conductive layer 312 includes, for example, performing the ion implantation process after one undoped polysilicon layer (not shown) is formed through the CVD process, or the doped polysilicon layer can be formed by adopting the in-situ implanting operation in the CVD process. The material of the conductive layer 332 can also be other metal materials.

Next, a patterned photoresist layer 334 is formed over the substrate 300. A method of forming the patterned photoresist layer 334 includes forming one photoresist material layer over the whole substrate 300 at first. The exposure process and the development process are then implemented to form the patterned photoresist layer 334.

Figure 3H:
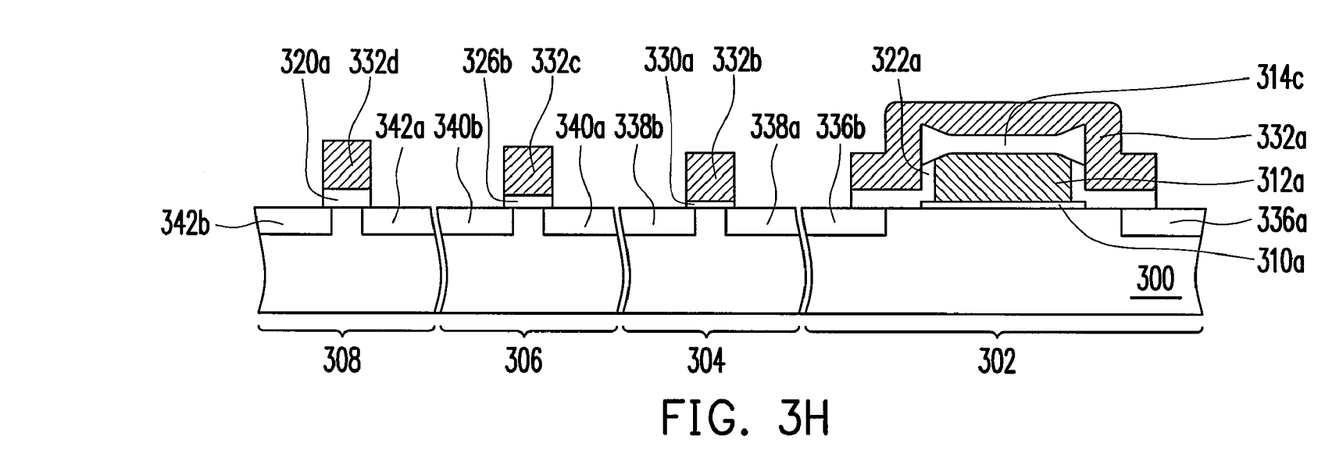

Referring to FIG. 3H, a portion of the conductive layer 332, the inter-gate dielectric layer 322, the gate dielectric layer 320, the gate dielectric layer 326a and the gate dielectric layer 330 are removed using the patterned photoresist layer 334 as the mask to form conductive layers 332a, 332b, 332c and 332d, an inter-gate dielectric layer 322a, and gate dielectric layers 320a, 326b and 330a. The patterned conductive layer 332a is used as a control gate, while the patterned conductive layers 332b, 332c and 332d are used as gates. A method of removing a portion of the conductive layer 332, the inter-gate dielectric layer 322 and the gate dielectric layers 320, 326a and 330 includes performing the dry etching process, such as the reactive ion etching operation, for example. Next, the patterned photoresist layer 334 is removed. A method of removing the patterned photoresist layer 334 includes, for example, performing the wet photoresist etching or the dry photoresist etching. After the removal of the patterned photoresist layer 334, source/drain regions 336a, 336b, 338a, 338b, 340a, 340b, 342a and 342b are formed in the substrate 300 at two sides of the conductive layer 332a (the control gate) and the conductive layers 332b, 332c and 332d (the gates). A method of forming the source/drain regions 336a, 336b, 338a, 338b, 340a, 340b, 342a and 342b includes performing a dopant implantation process using the conductive layer 332a (the control gate) and the conductive layers 332b, 332c and 332d (the gates) as the masks.

As shown in FIG. 3H, a thickness of the gate dielectric layer 320a is larger than a thickness of the gate dielectric layer 326b, and the thickness of the gate dielectric layer 326b is larger than a thickness of the gate dielectric layer 330a. In the high voltage device region 308, a high voltage device is constituted by the gate 322d, the gate dielectric layer 320a and the source/drain regions 342a and 342b. The thickness of the gate dielectric layer 320a is approximately 970 angstroms, for example, and a threshold voltage of the high voltage device is 32 V, for example. In the medium voltage device region 306, a medium voltage device is constituted by the gate 322c, the gate dielectric layer 326b and the source/drain regions 340a and 340b. The thickness of the gate dielectric layer 326b is approximately 120 angstroms, for example, and a threshold voltage of the medium voltage device is 5.5 V, for example. In the low voltage device region 304, a low voltage device is constituted by the gate 322b, the gate dielectric layer 330a and the source/drain regions 338a and 338b. The thickness of the gate dielectric layer 330a is approximately 33 angstroms, for example, and a threshold voltage of the low voltage device is 1.8 V, for example. The subsequent process of forming the MTP memory is familiar to those skilled in the art, and thus it is not described hereinafter.

The above embodiment is illustrated by taking the memory cell region 302, the low voltage device region 304, the medium voltage device region 306 and the high voltage device region 308 of the substrate 300 for example. Indeed, the method of manufacturing the MTP memory in the present invention may be applied to the substrate merely having the memory cell region 302 and one periphery circuit region (i.e. one of the high voltage device region 308, the low voltage device region 304 and the medium voltage device region 306), to the substrate having the memory cell region 302 and two or more periphery circuit regions (any two of the high voltage device region 308, the low voltage device region 304 and the medium voltage device region 306 or more), or to the substrate having the memory cell region 302 and more than three periphery circuit regions.

In the method of manufacturing the MTP memory provided by the present invention, the inter-gate dielectric layer 314a is disposed between the mask layer 316a and the conductive layer 312a (the floating gate). Thus, during the formation of the gate dielectric layer 320 of the high voltage device, the thickness of the inter-gate dielectric layer 314a at the edges of the conductive layer 312a (the floating gate) can be increased, and the top corner of the conductive layer 312a (the floating gate) is rounded, thus improving data retention of the device.

Besides, in the subsequent process of forming the gate dielectric layer 326a of the medium voltage device and the gate dielectric layer 330 of the low voltage device, the thickness of the inter-gate dielectric layer 314a can be further increased. In view of the foregoing, the MTP memory of the present invention can be fabricated through a simple process, and the fabrication of the MTP memory can be integrated into the fabrication of the normal periphery circuit devices, reducing the manufacturing costs.

Based on the above, in the MTP memory of the present invention, the thickness of the inter-gate dielectric layer at the edges of the floating gate is larger than the thickness of the inter-gate dielectric layer in the central portion of the floating gate. Therefore, leakage current is not apt to occur between the top corner of the floating gate and the control gate. Moreover, the rounded top corner of the floating gate is capable of preventing electrical field concentration, spike discharge, and leakage current of the device, which brings about an improvement of data retention.

In the method of manufacturing the MTP memory provided by the present invention, the inter-gate dielectric layer is disposed between the mask layer and the floating gate. The thickness of the inter-gate dielectric layer at the edges of the floating gate can be increased by implementing the thermal oxidation process, whereby the top corner of the floating gate is rounded. Thus, data retention of the device can be improved. Further, thanks to the simple process of manufacturing the MTP memory in the present invention, the fabrication of the MTP memory can be integrated to the fabrication of the normal periphery circuit devices, reducing the manufacturing costs.

As the fabrication of the MTP memory in the present invention is integrated into the fabrication of the normal periphery circuit devices, the inter-gate dielectric layer is disposed between the mask layer and the floating gate. Accordingly, during the formation of the gate dielectric layer of the high voltage device, the thickness of the inter-gate dielectric layer at the edges of the conductive layer (the floating gate) can be increased, and the top corner of the conductive layer (the floating gate) is rounded, improving data retention of the device.

Besides, in the subsequent process of forming the gate dielectric layer of the medium voltage device and the gate dielectric layer of the low voltage device, the thickness of the inter-gate dielectric layer can be further increased. In view of the foregoing, the MTP memory of the present invention can be fabricated through the simple process, and the fabrication of the MTP memory can be integrated into the fabrication of the normal periphery circuit devices, which reduces the manufacturing costs.

What is claimed is:

1. A multi-time programmable (MTP) memory, comprising:
    a tunneling dielectric layer disposed on a substrate;
    a floating gate disposed on the tunneling dielectric layer;
    a first inter-gate dielectric layer disposed on the floating gate, wherein the first inter-gate dielectric layer has a first thickness at edges of the floating gate and a second thickness over a central portion of the floating gate, and the first thickness is larger than the second thickness;
    a second inter-gate dielectric layer disposed over a sidewall of the floating gate and directly formed on a top surface of the substrate; and
    a control gate disposed on the first inter-gate dielectric layer and extended onto the second inter-gate dielectric layer.

2. The MTP memory as claimed in claim 1, wherein the floating gate has a rounded top corner.

3. The MTP memory as claimed in claim 1, wherein a material of the first inter-gate dielectric layer and a material of the second inter-gate dielectric layer comprise silicon oxide.

4. The MTP memory as claimed in claim 1, wherein a material of the control gate comprises doped polysilicon.

5. The MTP memory as claimed in claim 1, wherein a material of the floating gate comprises doped polysilicon.

6. The MTP memory as claimed in claim 1, wherein a material of the tunneling dielectric layer comprises silicon oxide.

* * * * *